Figure 1:
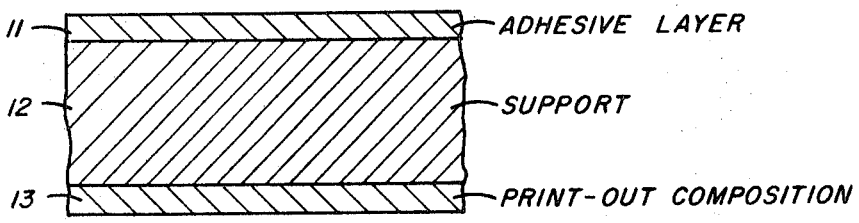
Figure 2:
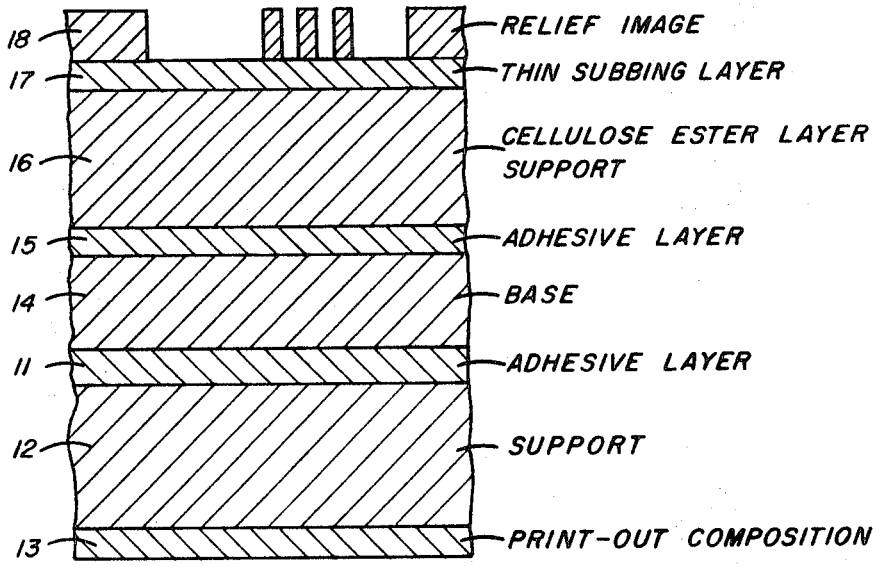

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED AUGUST 31, 1971

889 O.G. 1362

T889,003

MAKEREADY METHODS AND PRINTING PLATES UTILIZING SAID MAKEREADY

Henry C. Staehle, Douglas G. Borden, and James McNally, Jr., all of Kodak Park, Rochester, N.Y. 14650

Filed Mar. 5, 1970, Ser. No. 16,783
**Int. Cl. G03c *5/08;* G03f *9/00***
U.S. Cl. 96—27
1 Sheet Drawing. 13 Pages Specification

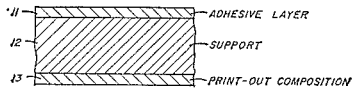

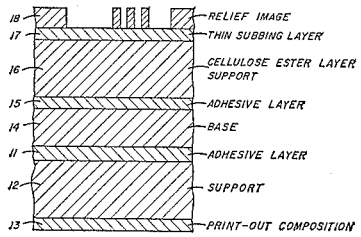

A print-out image-forming layer on an easily cut and stripped adhesive backed support may be used on the back side of a relief printing plate to provide a makeready means for adjusting pressure on printing areas of a printing plate. A method for forming the makeready comprises coating a light-sensitive, preferably print-out, composition in a film-forming vehicle on one side of a support and an adhesive on the opposite side, adhering the adhesive side of the support to the back side of a printing plate, exposing the light-sensitive composition in register with the printing plate relief image and utilizing the image in the sensitive composition as a guide for removal of the film from non-image areas.

Aug. 31, 1971 H. C. STAEHLE ET AL T889,003

MAKEREADY METHODS AND PRINTING PLATES UTILIZING SAID MAKEREADY

Filed March 5, 1970

HENRY C. STAEHLE
DOUGLAS G. BORDEN
JAMES G. McNALLY, JR.
INVENTORS

BY Henry E. Byers

ATTORNEY